(12) United States Patent
Tsubota

(10) Patent No.: US 8,867,195 B2
(45) Date of Patent: Oct. 21, 2014

(54) ATTACHMENT/DETACHMENT MECHANISM FOR ELECTRONICS UNIT, ELECTRONICS UNIT, POWER SUPPLY UNIT, AND ELECTRONICS APPARATUS

(75) Inventor: Tetsuro Tsubota, Kanagawa (JP)

(73) Assignee: Sony Corporation, Tokyo (JP)

( * ) Notice: Subject to any disclaimer, the term of this patent is extended or adjusted under 35 U.S.C. 154(b) by 868 days.

(21) Appl. No.: 13/079,271

(22) Filed: Apr. 4, 2011

(65) Prior Publication Data

US 2011/0249382 A1 Oct. 13, 2011

(30) Foreign Application Priority Data

Apr. 9, 2010 (JP) ................................ P2010-090071

(51) Int. Cl.
- *H05K 5/00* (2006.01)
- *H05K 7/14* (2006.01)
- *H05K 7/20* (2006.01)

(52) U.S. Cl.
CPC .......... *H05K 7/1414* (2013.01); *H05K 7/20145* (2013.01)
USPC ...... 361/679.01; 361/724; 361/727; 361/740; 361/747; 361/801

(58) Field of Classification Search
CPC ........... G06F 1/187; G06F 1/26; G06F 1/188; H05K 7/1411
USPC .................... 361/724–727, 740, 747, 679.01, 361/679.02, 801, 802; 312/223.2, 226
See application file for complete search history.

(56) References Cited

U.S. PATENT DOCUMENTS

| | | | | |
|---|---|---|---|---|
| 6,915,562 B2* | 7/2005 | Joist et al. | ......................... | 29/758 |
| 7,586,748 B2* | 9/2009 | Chen | .............................. | 361/727 |
| 8,369,094 B2* | 2/2013 | McLean et al. | ............... | 361/747 |
| 2006/0215373 A1* | 9/2006 | Joist et al. | ...................... | 361/726 |
| 2008/0013288 A1* | 1/2008 | Karstens | ....................... | 361/726 |
| 2008/0101040 A1* | 5/2008 | Tang | .............................. | 361/727 |

FOREIGN PATENT DOCUMENTS

| | | |
|---|---|---|
| JP | 2005 197536 | 7/2005 |
| JP | 2008 91120 | 4/2008 |

* cited by examiner

*Primary Examiner* — Robert J Hoffberg
*Assistant Examiner* — Hung Dang
(74) *Attorney, Agent, or Firm* — Frommer Lawrence & Haug LLP; William S. Frommer

(57) ABSTRACT

Disclosed herein is an attachment/detachment mechanism for an electronics unit mounted on a casing in an attachable/detachable manner, including: a position-keeping type switch switching between first and second states of the electronics unit; a lever switching between a securing state where the electronics unit is secured to the casing and an attachable/detachable state where the electronics unit is made attachable/detachable to/from the casing; a first restricting member switching between a restricting state where state-switching of the lever is restricted and a permitting state where the state-switching of the lever is permitted; and a second restricting member traveling between a first position where the state-switching of the first restricting member is restricted and the state-switching of the position-keeping type switch is permitted, and a second position where the state-switching of the first restricting member is permitted and the state-switching of the position-keeping type switch from the first state to the second state is restricted.

14 Claims, 13 Drawing Sheets

ATTACHMENT/DETACHMENT MECHANISM FOR ELECTRONICS UNIT, ELECTRONICS UNIT, POWER SUPPLY UNIT, AND ELECTRONICS APPARATUS

BACKGROUND OF THE INVENTION

1. Field of the Invention

The present invention relates to an attachment/detachment mechanism for an electronics unit mounted on a casing in an attachable/detachable manner, the electronics unit, a power-supply unit and an electronics apparatus.

2. Description of the Related Art

There are known electronics apparatuses in which an electronics unit such as a power-supply unit or the like is mounted on a casing in an attachable/detachable manner. There are electronics apparatuses in which a power-supply unit can be removed from a casing while power supplied to the power-supply unit is not shut down. There are also electronics apparatuses in which an electronics unit can be attached to a casing while a power switch of a power-supply unit remains in an activated state.

The inadvertent attachment/detachment operation of the power-supply unit as described above has caused failure such as the adhesion of a contact terminal portion between a power connector on a power-supply unit side and a power connector on a casing side. Additionally, the inadvertent attachment/detachment operation of a power-supply unit has caused the failure of the power-supply unit, the failure of an electronics apparatus on which the power-supply unit is mounted, the malfunction of a system to which the electronics apparatus is connected, etc.

To eliminate such failures, there is a proposal of a technology (see e.g. Japanese Patent Laid-open No. 2005-197536) as below. A power switch of a power-supply unit and a lock-releasing portion for attachment/detachment operation are provided close to each other to interfere with each other. Such provision can prevent inadvertent attachment/detachment operation with the power switch of the power-supply unit remaining in a turned-on state.

As the similar technology, the following technology is proposed in which the inadvertent attachment/detachment operation of a connector with a power switch of a terminal device remaining in a turned-on state is prevented (see e.g. Japanese Patent Laid-open No. 2008-91120).

SUMMARY OF THE INVENTION

However, if the power switch and a member for restricting the attachment/detachment operation are made to interfere with each other, the forced attachment/detachment operation may break the power switch or the member for restricting the attachment/detachment operation. If the member for restricting the attachment/detachment operation is increased in size and in weight, it may become difficult to handle as an operating portion in some cases.

Therefore, it is desirable to provide an attachment/detachment mechanism for an electronics unit, an electronics unit, a power-supply unit and an electronics apparatus which prevents inadvertent attachment/detachment operation of the electronics unit and to facilitate the attachment/detachment operation of the electronics unit.

According to an embodiment of the present invention, there is provided an attachment/detachment mechanism for an electronics unit mounted on a casing in an attachable/detachable manner, the mechanism including a position-keeping type switch, a lever, a first restricting member and a second restricting member. The position-keeping type switch switches between first and second states of the electronics unit. The lever switches between a securing state where the electronics unit is secured to the casing and an attachable/detachable state where the electronics unit is made attachable/detachable to/from the casing. The first restricting member switches between a restricting state where state-switching of the lever is restricted and a permitting state where the state-switching of the lever is permitted. The second restricting member travels between a first position where the state-switching of the first restricting member is restricted and the state-switching of the position-keeping type switch is permitted, and a second position where the state-switching of the first restricting member is permitted and the state-switching of the position-keeping type switch from the first state to second state is restricted.

The electronics unit is a unit on which an electronic device having a predetermined function is mounted. Examples of the electronics unit include an information processing unit having an information processing function, a signal exchanging unit having a signal exchanging function, and a communication unit having a communication function. Further, the electronics unit includes a power-supply unit that creates given power from an input power-supply (e.g. a commercial power supply) and supplies it to a load side.

According to another embodiment of the present invention, there is provided an electronics apparatus in which an electronics unit is mounted to a casing in an attachable/detachable manner. The casing is provided with a retaining portion retaining the electronics unit mounted thereon in an attachable/detachable manner. The electronics unit includes a position-keeping type switch, a lever, a first restricting member and a second restricting member.

The position-keeping type switch switches between the first and second states of the electronics unit. The lever switches between an engaging state where the electronics unit is engaged with the retaining portion and an attachable/detachable state where the electronics unit is made attachable/detachable to/from the casing. The first restricting member switches between a restricting state where state-switching of the lever is restricted and a permitting state where the state-switching of the lever is permitted. The second restricting member travels between a first position where the state-switching of the first restricting member is restricted and the state-switching of the position-keeping type switch is permitted, and a second position where the state-switching of the first restricting member is permitted and the state-switching of the position-keeping type switch from the first state to the second state is restricted.

The attachment/detachment mechanism for an electronics unit, the electronics unit, the power-supply unit and the electronics apparatus can each prevent an inadvertent attachment/detachment operation of the electronics unit and facilitate the attachment/detachment operation of the electronics unit.

DETAILED DESCRIPTION OF THE PREFERRED EMBODIMENTS

Figure 1:
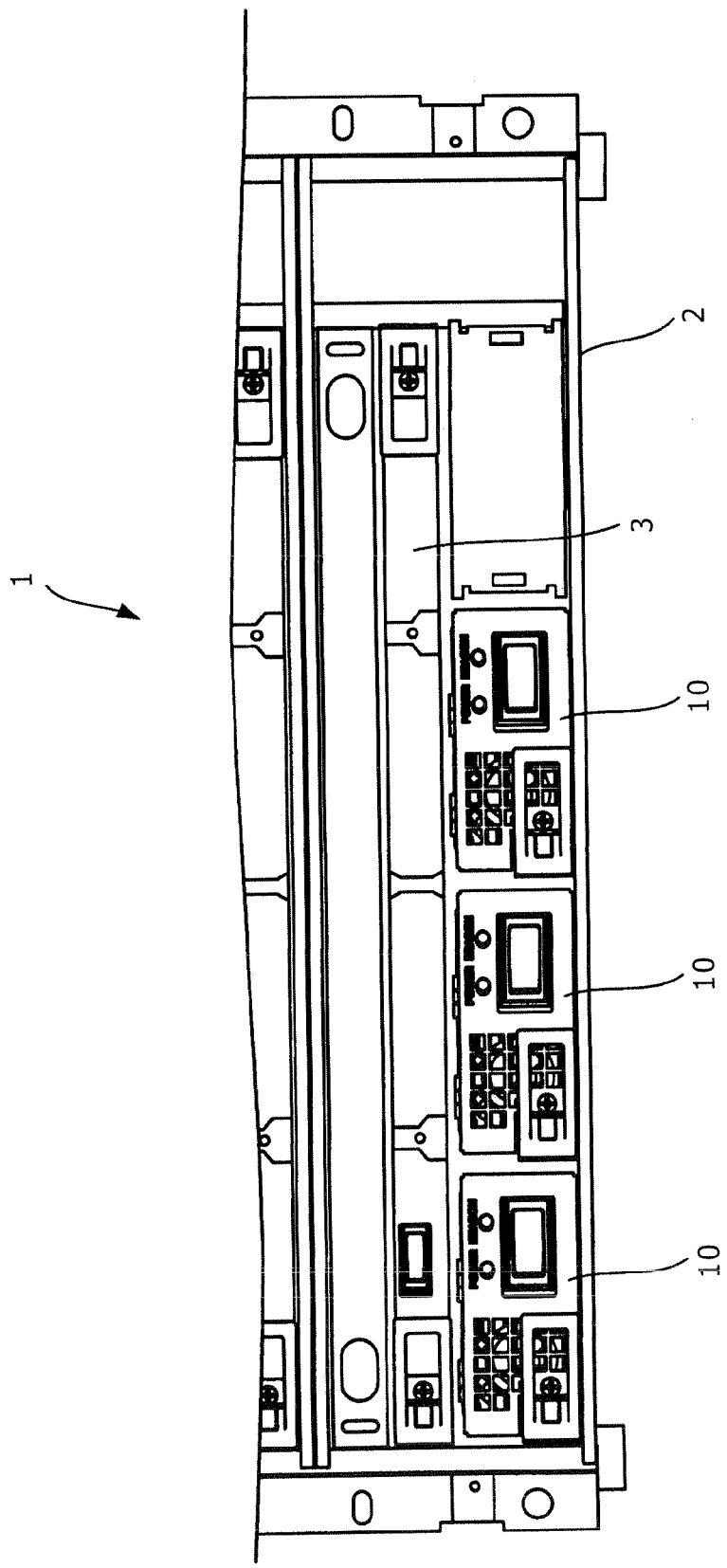
FIG. 1 is a partial front view of an electronics apparatus according to a first embodiment.
Figure 2:
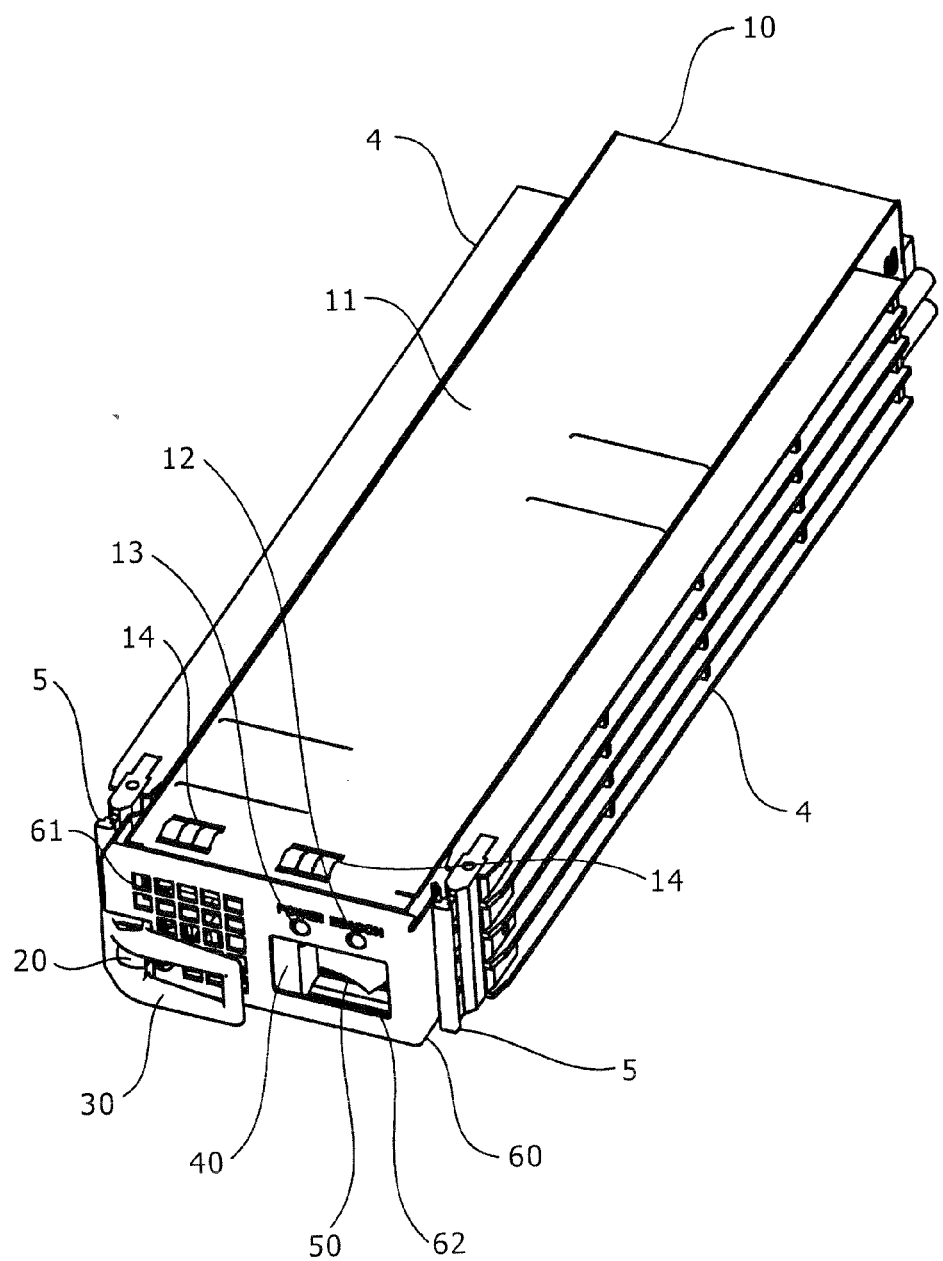
FIG. 2 is a perspective view of a power-supply unit according to the first embodiment.
Figure 3:
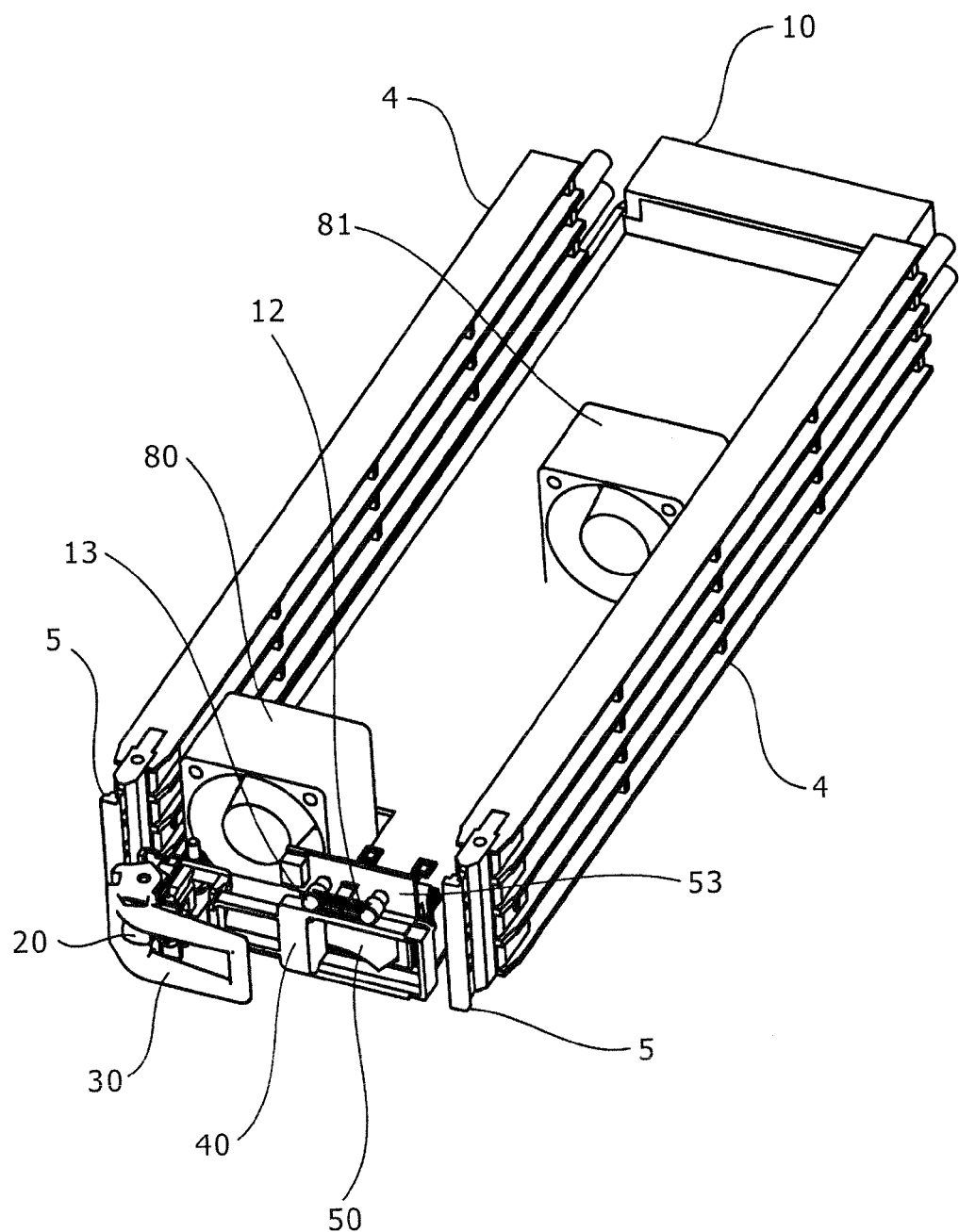
FIG. 3 is an exploded perspective view of the power-supply unit according to the first embodiment.

Preferred embodiments of the present invention will hereinafter be described with reference to the drawings. An electronics apparatus, an electronics unit and a power-supply unit are described with reference to FIGS. 1 to 3. FIG. 1 is a partial front view of the electronics apparatus of the first embodiment. FIG. 2 is a perspective view of the power-supply unit according to the first embodiment. FIG. 3 is an exploded perspective view of the power-supply unit of the first embodiment.

An electronics apparatus 1 selectively mounts electronics units 3 and power-supply units 10 thereon in accordance with use application and required capability. Examples of the electronics apparatus 1 include a rack-mountable server, a disk array apparatus, a network device such as a router, a layer 3 switch or the like for controlling communication, and a switcher switchably controlling a video signal and an audio signal. The electronics apparatus 1 is such that the electronics units 3 and the power-supply units 10 are mounted on an electronics housing rack 2 in an attachable/detachable manner.

The electronics housing rack 2 has a housing space sectioned into compartments by rack guides 4 (mount rails) and mounts the electronics unit 3 and the power-supply unit 10 housed in each of the compartments, i.e., on a unit basis. The electronics housing rack 2 is provided with a power-supply line used to supply electric power to each of the compartments and with a signal line used to signal-connect the compartments together.

The rack guide 4 functions not only as a partition member partitioning the housing space but also as a guide member guiding the electronics unit 3 and the power-supply unit 10 into each of the compartments. In addition, the rack guide 4 is provided with a unit retaining portion 5 for retaining the electronics unit 3 and the power-supply unit 10 in each of the compartments and also functions as a retaining member retaining the electronics unit 3 and the power-supply unit 10 in each of the compartments.

The electronics unit 3 is housed in each of the compartments of the electronics housing rack 2, so that a connector lying on the rear side of the electronics unit 3 connects with a connector of the electronics housing rack 2. In this way, the electronics unit 3 connects with the power-supply line and input-output signal line of the electronics housing rack 2. The electronics unit 3 mounts thereon electronics having a predetermined function.

For example, the electronics unit 3 is an information processing unit if having an information processing function. More specifically, the information processing unit is e.g. a server unit having a server function. In this case, the electronics apparatus 1 is a server installed in a data center or the like. The electronics unit is a communication unit if having a communication function. More specifically, the communication unit is e.g. a router unit or a layer 3 switch unit having a routing function or the like. In this case, the electronics apparatus 1 is a center router installed in an internet service provider or the like. The electronics unit is a signal exchange unit if having a signal exchange function. More specifically, the signal exchange unit is e.g. a video signal exchange unit or audio signal exchange unit having s switching function and the like. In this case, the electronics apparatus 1 is a switcher installed in a broadcast station or the like.

The power-supply unit 10 is housed in each of the compartments of the electronics housing rack 2, so that a connector lying on the rear side of the power-supply unit 10 connects with a connector of the electronics housing rack 2. In this way, the power-supply unit 10 connects with the power-supply line and input-output signal line of the electronics housing rack 2. The power-supply unit 10 receives commercial power via the electronics housing rack 2 and supplies given power to the electronics unit 3 being a load side via the electronics housing rack 2. The electronics apparatus 1 mounts a single or a plurality of the power-supply units 10 thereon in accordance with required electric energy.

A description is here given of external appearance of the power-supply unit 10. The power-supply unit 10 is mounted on the electronics housing rack 2 in such a manner that a mounting table on which the electronics unit 3 or the power-supply unit 10 is mounted is housed in an area defined by a pair of the rack guides 4.

The power-supply unit 10 is a rectangular parallelepipedic box internally including a power switch board 53, a fan 80, a fan 81, and a power-supply board not shown. The power-supply unit 10 has a display portion 12, a display portion 13, a lock-releasing button 20, a power-supply attachment/detachment lever 30, a switch cover 40, a power switch 50 and a front cover 60 installed on a front surface, and a top panel 11 and plate springs 14 installed on an top surface. The power-supply unit 10 has a connector portion, not illustrated, installed on a rear surface and a plate spring, not illustrated, installed on a bottom surface.

The front surface cover 60 has a ventilation opening portion 61, an operation opening portion 62, an opening portion for the display portion 12 and for the display portion 13. The ventilation opening portion 61 is a ventilation hole (ventilating opening) of the power-supply unit 10 and is located in front of a fan 80. The operation opening portion 62 is an opening used by an operator to operate the power switch 50. The operation opening portion 62 is an opening used by an operator to operatively slide the switch cover 40.

The power switch board 53 is adapted to mount the display portion 12, the display portion 13 and the power switch 50 thereon. The display portion 12 and the display portion 13 are LEDs (Light Emitting Diode) attached to the power switch board 53 and informs the operating condition of the power-supply unit 10 through light-emitting modes (emission color, lighting, extinction, blinking intervals or the like).

The power switch 50 is a position-keeping type switch (rocker switch) switchable between the power shutdown (OFF) state and power activation (ON) state of the power-supply unit 10.

The switch cover 40 restricts the action of the lock-releasing button 20 by slidably traveling in a left-right direction as viewed from the front.

The power-supply attachment/detachment lever 30 is turned in a given range around a turning axis located on the left side as viewed from the front with the rock-releasing button 20 pressed from the front side. While being laid (see FIG. 2), the power-supply attachment/detachment lever 30 is fitted to the unit retaining portion 5 to secure the power-supply unit 10 to the electronics housing rack 2. With the power-supply attachment/detachment lever 30 turned, the fitting of the power-supply attachment/detachment lever 30 to the unit retaining portion 5 is released and the power-supply unit 10 is pulled out toward the front side.

Figure 4A:
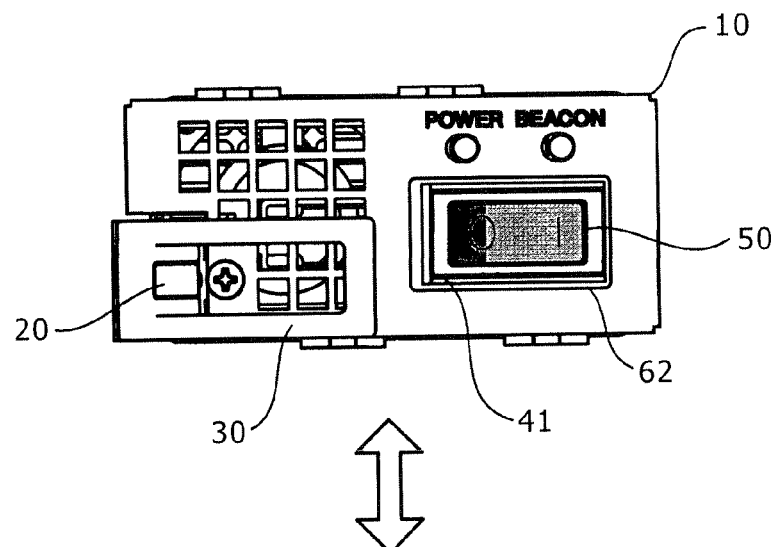
FIGS. 4A, 4B and 4C are views for assistance in explaining the attachment/detachment operation of the power-supply unit according to the first embodiment.
Figure 4B:
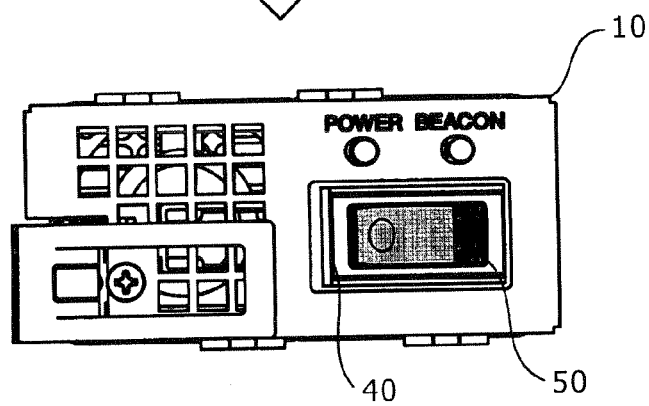
Figure 4C:
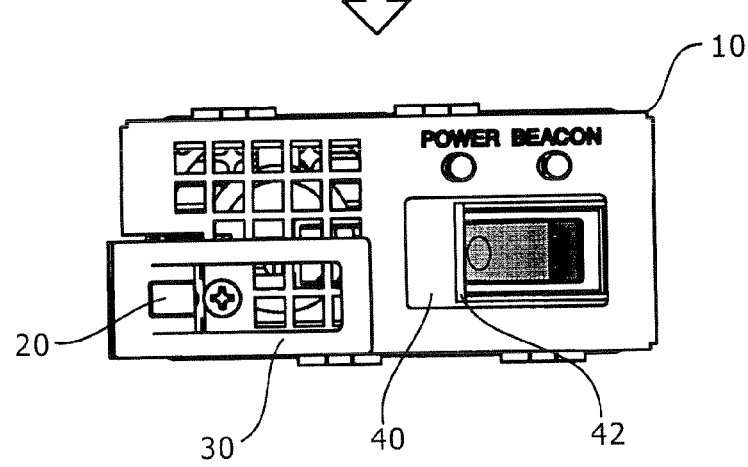

The attachment/detachment operation of the power-supply unit 10 in the first embodiment is next described with reference to FIGS. 4A, 4B and 4C. FIGS. 4A, 4B and 4C are views for assistance in explaining the attachment/detachment operation of the power-supply unit of the first embodiment.

FIG. 4A illustrates the power-supply unit 10 in a power-on state resulting from the operating portion of the power switch 50 being laid toward the power-on side. In this state, the operation opening portion 62 and the operation opening portion 41 of the switch cover 40 are opened at almost the same position. Incidentally, the operation opening portion 41 is an opening used by an operator to operate the power switch 50. The power switch 50 can be operated to switch into any state of power-on and power-off through the opening at almost the same position of the operation opening portion 62 and the operation opening portion 41.

In this state the switch cover 40 restricts the depressing operation of the lock-releasing button 20. Since the depressing operation of the lock-releasing button 20 is restricted by the switch cover 40, the lock of the power-supply attachment/detachment lever 30 is not released. Therefore, the power-supply attachment/detachment lever 30 cannot be moved. In addition, in this state, the operating portion of the power switch 50 laid toward the power-on side is such that the power-off side is raised. The operating portion of the power switch 50 whose power-off side is raised interferes with the operation opening portion 41 to restrict the rightward slide of the switch cover 40.

FIG. 4B illustrates the power-supply unit 10 in the power-off state resulting from the operating portion of the power switch 50 being laid toward the power-off side. In this state, the operating portion of the power switch 50 laid toward the power-off side is such that the power-on side is raised. The switch cover 40 becomes slidable rightward without interference with the operating portion of the power switch 50 whose power-off side is laid. Before interfering with the operating portion of the power switch 50, the further slid switch cover 40 is restricted in slide amount by a stopper portion described later. The restriction of the slide amount of the switch cover 40 prevents the erroneous operation of the power switch 50 due to the interference between the switch cover 40 with the operating portion of the power switch 50.

FIG. 4C illustrates the power-supply unit 10 whose switch cover 40 is slid rightward. In this state, the operation opening portion 62 and the operation opening portion 41 of the switch cover 40 are opened with their respective positions differing from each other. In this way, an actual operating opening is reduced so that an operator can perceive the state where the operation of the power switch 50 is restricted. The switch cover 40 is located at a position not interfering with the operating position of the power switch 50 whose power-off side is laid. However, if the operating portion of the power switch 50 is laid toward the power-on side, the switch cover 40 interferes with it. Therefore, the switch cover 40 restricts the power-on operation of the power switch 50.

In this state, the switch cover 40 permits the depressing operation of the lock-releasing button 20. Since the depressing operation of the lock-releasing button 20 is permitted by the switch cover 40, the power-supply attachment/detachment lever 30 can be moved (operated) by releasing the lock through the depressing operation of the lock-releasing button 20.

As described above, the power-supply unit 10 is such the power-supply attachment/detachment lever 30 used to remove the power-supply unit 10 cannot be operated in the power-on state. Therefore, the inadvertent attachment/detachment operation of the power-supply unit 10 can be prevented. In addition, the power-supply unit 10 cannot be brought into the power-on state in the operable state of the power-supply attachment/detachment lever 30. Therefore, the inadvertent attaching operation of the power-supply unit 10 can be prevented.

As described above, the operating portion (the power-supply attachment/detachment lever 30) for attaching/detaching the power-supply unit 10 is separate from the operation restricting portion (the switch cover 40) of the power switch 50. Therefore, an operator can easily perform their operation. Additionally, the operating portion for attaching/detaching the power-supply unit 10 and the operation restricting portion of the power switch 50 cannot concurrently be performed. Therefore, the erroneous operation of the operator can be prevented.

The operation of the attachment/detachment mechanism of the power-supply unit 10 according to the first embodiment is next described with reference to FIGS. 5 to 8. FIGS. 5 to 8 are perspective views of the attachment/detachment mechanism according to the first embodiment.

Figure 5:
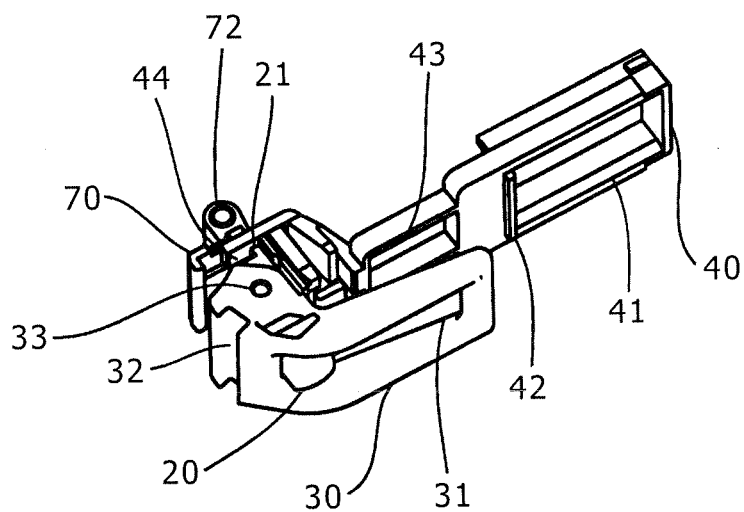
FIGS. 5 to 8 are perspective views of an attachment/detachment mechanism according to the first embodiment.

FIG. 5 illustrates the mutual positional relationship among the switch cover 40, the lock-releasing button 20 and the power-supply attachment/detachment lever 30 encountered when the operating portion of the power switch 50 is made operable.

The switch cover 40 slidably travels leftward as viewed from the front surface and is at a position where the lock-releasing operation of the lock-releasing button 20 is restricted (the lock-releasing operation restricting position). The lock-release operation restricting position is also a position where the switching of the operating portion of the power switch 50 is permitted (the switch-state switching permitting position).

The lock-releasing button 20 is biased toward the front as viewed from the front surface side by an elastic member (spring) not illustrated and is at a retreat position retreated from the traveling range of the lock-releasing restricting portion 44. The retreat position is also a position where the turning of the power-supply attachment/detachment lever 30 is restricted (the power-supply attachment/detachment operation restricting position). The power-supply attachment/detachment lever 30 is at a securing position where an engaging portion 32 is engaged with the unit retaining portion 5 to secure the power-supply unit 10 to the electronics housing rack 2.

A description is here given of each of the switch cover 40, the lock-releasing button 20 and the power-supply attachment/detachment lever 30.

The switch cover 40 is a generally plate-like (crank-shaped) resin molding with a step. The switch cover 40 has an operation opening portion 41 on the right end side of a front stage as viewed from the front surface side, a ventilation opening portion 43 on the step side of the front stage, and a lock-releasing restricting portion 44 at a rear stage. Further, the switch cover 40 has a slide operating portion 42 at a left (central side) end portion of the operation opening portion 41. The slide operating portion 42 serves as a lug making it easy for the operator of the operation opening portion 41 to slidably shift the switch cover 40.

The lock-releasing restricting portion 44 slidably travels to advance into the movable range of the lock-releasing button 20 or to retreat from the movable range. The lock-releasing restricting portion 44 interferes with the contact portion 21 of the lock-releasing button 20 in an advancing state (the lock-releasing operation restricting position) to restrict the lock-releasing operation.

The lock-releasing button 20 is a generally column-like resin molding. The lock-releasing button 20 is provided with a depressing operation end portion as one end with respect to the movable direction so as to pass through the ventilation opening portion 31 of the power-supply attachment/detachment lever 30. The lock-releasing button 20 is provided with the contact portion 21 with the lock-releasing restricting portion 44 at the other end with respect to the movable direction. The lock-releasing button 20 comes into contact with the power-supply attachment/detachment lever 30 at its lateral surface to restrict the turning of the power-supply attachment/detachment lever 30.

The power-supply attachment/detachment lever 30 has a general L-shape and is provided with the engaging portion 32 and a turning shaft 33 at the short side of the L-shape and with the ventilation opening portion 31 at the long side of the L-shape serving as a grip portion. The power-supply attachment/detachment lever 30 is pivotally supported by the unit guide 70 via the turning shaft 33. The unit guide 70 is attached to the casing of the power-supply unit 10 at a casing attachment portion 72.

Incidentally, when the power-supply attachment/detachment lever 30 is at the securing position, the ventilation opening portion 31 is located in front of the ventilation opening portion 61 to serve as a vent hole (ventilation window) of the power-supply unit 10. Additionally, when the switch cover 40 is at the switch-state switching permitting position, the ventilation opening portion 43 is located in rear of the ventilation opening portion 61 to serve as a vent hole of the power-supply unit 10. Thus, while achieving an improvement in operability, the attachment/detachment mechanism does not impair the cooling performance of the power-supply unit 10 even if the power-supply unit 10 is in the power-on state.

Figure 6:
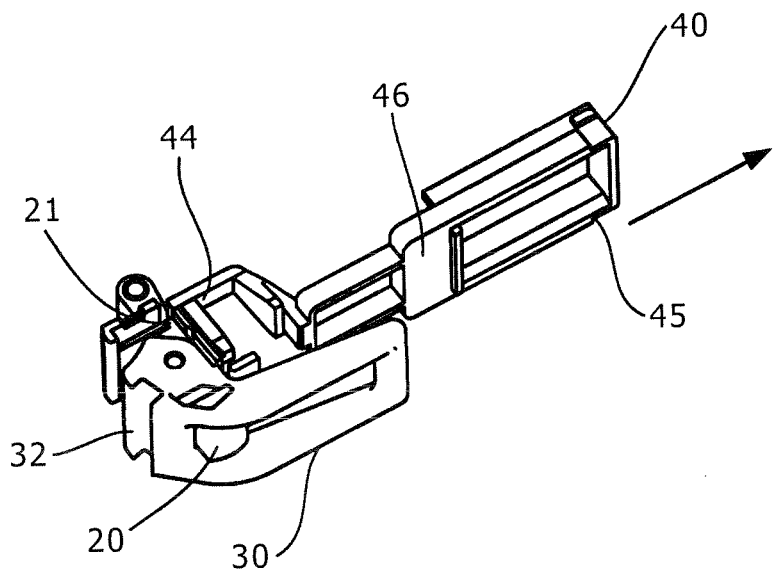

FIG. 6 illustrates the mutual positional relationship among the switch cover 40, the lock-releasing button 20 and the power-supply attachment/detachment lever 30 encountered when the power-supply unit 10 is in the power-off state and the switch cover 40 is slid rightward to make the operating portion of the power switch 50 inoperable.

The switch cover 40 slidably travels rightward as viewed from the front and is at such a position as to permit the lock-releasing operation of the lock-releasing button 20 (the lock-releasing operation permitting position). The lock-releasing operation permitting position is a position where the power switch 50 is brought into the power-off state and the switching of the operating portion of the power switch 50 is restricted (the switch-state switching restricting position).

The lock-releasing button 20 is at a retreat position where it is biased toward the front by the elastic member to be retreated from the traveling range of the lock-releasing restricting portion 44. At this time the lock-releasing button 20 is such that the contact portion 21 will not interfere with the lock-releasing restricting portion 44 because the switch cover 40 is at the lock-releasing operation permitting position. Therefore, the lock-releasing button 20 is in a depression-operable state. The power-supply attachment/detachment lever 30 is at the securing position where the engaging portion 32 is engaged with the unit retaining portion 5 to secure the power-supply unit 10 to the electronics housing rack 2.

Incidentally, the slide-travel distance of the switch cover 40 is limited to a position where the stopper portion 45 hits the front cover 60. In this case, the operation opening shutter portion 46 faces the operation opening portion 62 to limit the opening range of the operation opening portion 62. The operation opening shutter portion 46 shields the operation opening of the operation opening portion 62. In this way, the operator can perceive the state where the operation of the power switch 50 is restricted.

Figure 7:
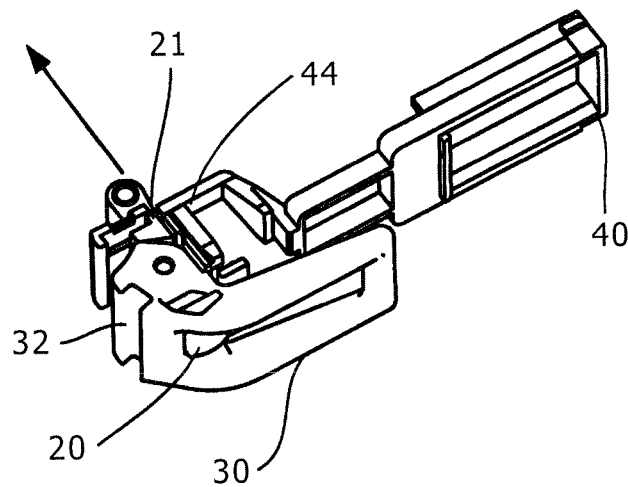

FIG. 7 illustrates the mutual positional relationship among the switch cover 40, the lock-releasing button 20 and the power-supply attachment/detachment lever 30 encountered when the rock-releasing button 20 is operatively depressed in a back direction (in the arrow direction in the figure) as viewed from the front surface with the switch cover 40 slid rightward.

The switch cover 40 is at the lock-releasing operation permitting position. The lock-releasing button 20 is operatively depressed against the biasing force to advance into the travel range of the lock-releasing restricting portion 44. Then, the lock-releasing button 20 is at such a position as to release the restriction of the turning of the power-supply attachment/detachment lever 30 (the power-supply attachment/detachment operation restriction releasing position). The lock-releasing button 20 lying at the power-supply attachment/detachment operation restriction releasing position restricts the leftward slide travel of the switch cover 40 as viewed from the front surface. The power-supply attachment/detachment lever 30 is at the securing position where the engaging portion 32 is engaged with the unit retaining portion 5 to secure the power-supply unit 10 to the electronics housing rack 2.

The lock-releasing button 20 has a recessed portion (a claw-receiving portion described later with FIG. 13) in a lateral surface. The power-supply attachment/detachment lever 30 is such that the restriction of turning is released by making it possible for a portion (a claw described later with FIG. 13) interfering with the lock-releasing button 20 lying at the power-supply attachment/detachment operation restricting position to be received in the recessed portion of the lock-releasing button 20 lying at the power-supply attachment/detachment operation restriction releasing position.

Figure 8:
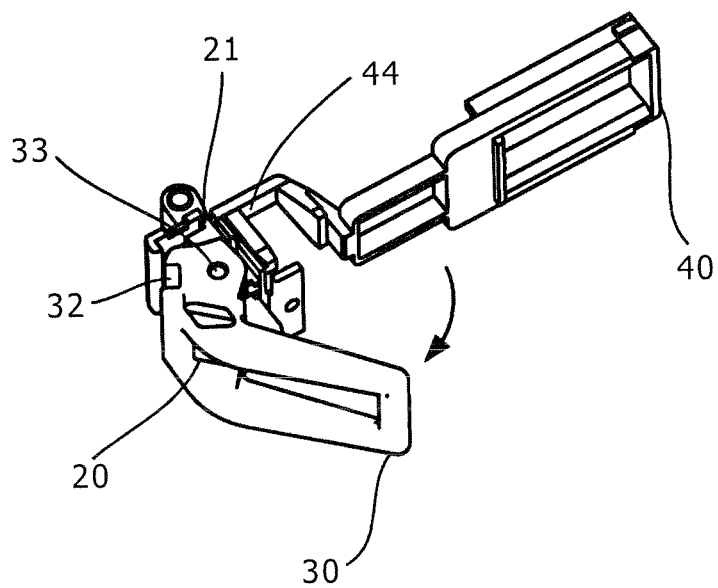

FIG. 8 illustrates the mutual positional relationship among the switch cover 40, the lock-releasing button 20 and the power-supply attachment/detachment lever 30 encountered when the power-supply attachment/detachment lever 30 is operatively turned clockwise as viewed from above (arrow-direction in the drawing) with the lock-releasing button 20 operatively depressed.

The switch cover 40 is at the lock-releasing operation permitting position. The lock-releasing button 20 is at the power-supply attachment/detachment operation restriction releasing position. The power-supply attachment/detachment lever 30 is at the attachable/detachable position where the engagement of the engaging portion 32 with the unit retaining portion 5 is released and the power-supply unit 10 is pulled out from the electronics housing rack 2.

In the state where the restriction of the turning of the power-supply attachment/detachment lever 30 is released, the operator can pull the power-supply attachment/detachment lever 30 toward the front side so as to be turned in the arrow-direction in the drawing around the turning shaft 33.

The power-supply attachment/detachment lever 30 lying at the attachable/detachable position allows the retaining portion 32 to release the engagement with the unit retaining portion 5. The power-supply attachment/detachment lever 30 lying at the attachable/detachable position pulls the power-supply unit 10 from the electronics housing rack 2 to a position to release the connection between the connector lying on the rear side of the power-supply unit 10 and the connector of the electronics housing rack 2.

Figure 9:
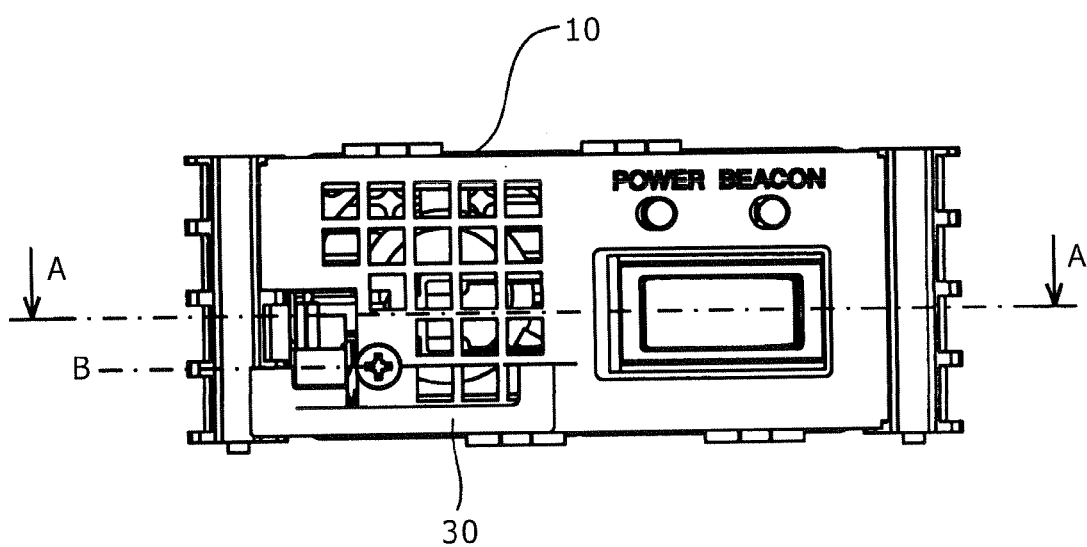
FIG. 9 is a front view of the power-supply unit according to the first embodiment.

The operation at the time of attachment/detachment of the power-supply unit 10 according to the first embodiment is next described with reference to FIGS. 9 to 13. FIG. 9 is a front view of the power-supply unit 10 of the first embodiment. FIGS. 10 to 13 are partial cross-sectional views of the power-supply unit according to the first embodiment.

FIGS. 10 to 13 are the cross-sectional views (see FIG. 9) taken along line A-A as viewed from the arrow direction. To facilitate the understanding of the relationship between the power-supply attachment/detachment lever 30 and the lock-releasing button 20, the description of the power-supply unit 10 illustrated in FIGS. 10 to 13 uses a model resulting from cutting the power-supply attachment/detachment lever 30 along line B (FIG. 9). Since FIGS. 10 to 13 illustrate different states at the time of attachment/detachment of the power-supply unit 10, they do not necessarily correspond to the state of the power-supply unit illustrated in FIG. 9.

Figure 10:
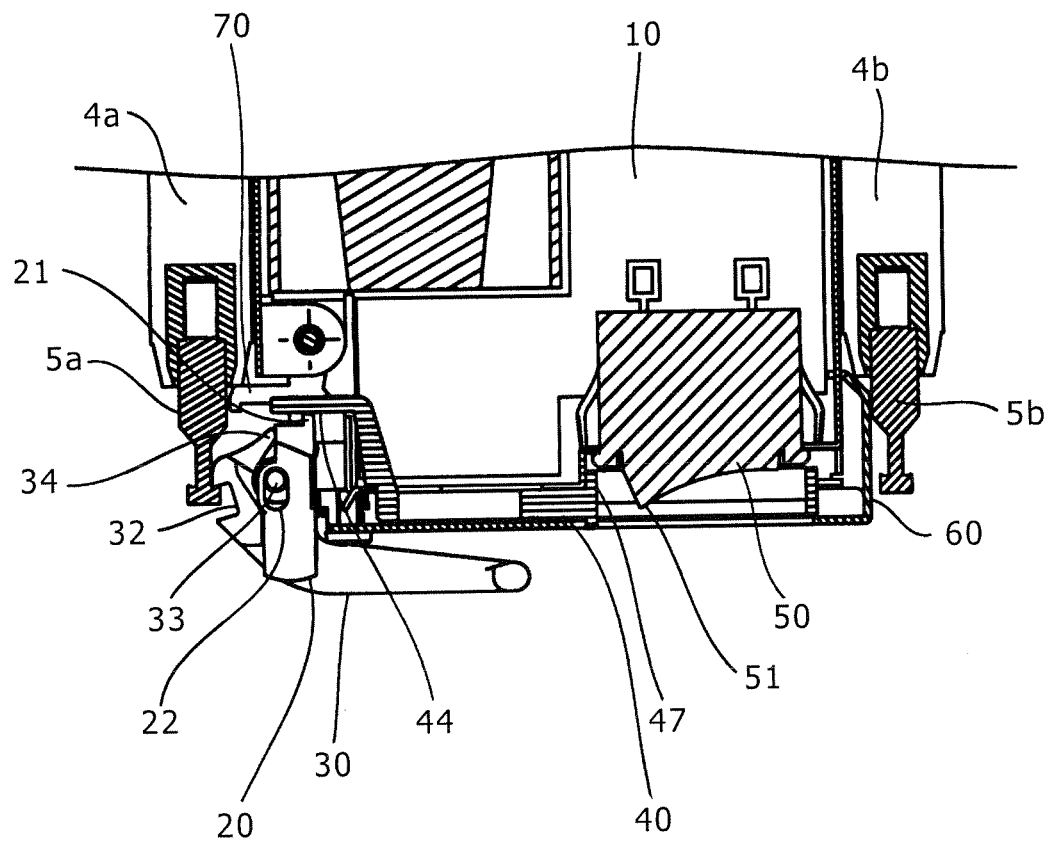
FIGS. 10 to 13 are partial cross-sectional views of the power-supply unit according to the first embodiment.

The power-supply unit 10 illustrated in FIG. 10 is secured to the electronics housing rack 2 while being in the power-on state.

The unit guide 70 and the unit retaining portion 5a come into contact with each other and the front cover 60 and the unit retaining portion 5b come into contact with each other. In this way, the power-supply unit 10 is guided between the rack guide 4a and the rack guide 4b and housed in the electronics housing rack 2. The power-supply unit 10 is secured to the electronics housing rack 2 with the engaging portion 32 engaged with the unit retaining portion 5a.

The switch cover 40 is in the lock-releasing operation restricting position, in which the lock-releasing restricting portion 44 and the contact portion 21 come into contact with each other to restrict the depressing operation of the lock-releasing button 20.

A movable operating portion 51 (a switching operating portion) of the power switch 50 is switching-operatable freely because of non-interference with the switch cover 40. The movable operating portion 51 of the power switch 50 in the power-on state is laid on the power-on side with the power-off side raised. Therefore, the interference between the movable operating portion 51 and the contact portion 47 restricts the rightward slide-travel of the switch cover 40.

The turning shaft 33 is in an elongate hole 22 so that the lock-releasing button 20 is restricted in movable range in the major axis direction of the elongate hole 22. The power-supply attachment/detachment lever 30 is such that a claw 34 comes into contact with the lateral surface of the lock-releasing button 20 to restrict the clockwise turning of the power-supply attachment/detachment lever 30.

Figure 11:
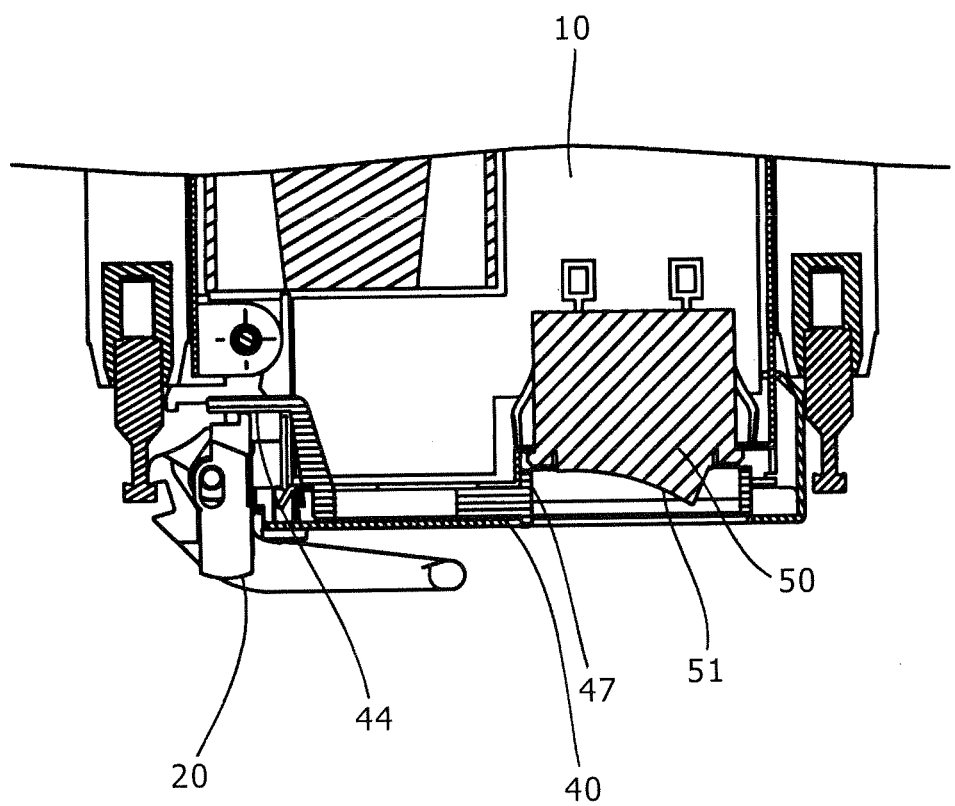

The power-supply unit 10 illustrated in FIG. 11 is secured to the electronics housing rack 2 while being in the power-off state.

The switch cover 40 is at the lock-releasing operation restricting position and the lock-releasing restricting portion 44 and the contact portion 21 come into contact with each other to restrict the depressing operation of the lock-releasing button 20.

Because of non-interference with the switch cover 40, the movable operating portion 51 of the power switch 50 is switching-operatable freely. In addition, the movable operating portion 51 of the power switch 50 in the power-on state is laid on the power-off side with the power-on side raised. Therefore, the movable operation portion 51 and the contact portion 47 do not interfere with each other. This permits the switch cover 40 to slidably travel rightward.

Figure 12:
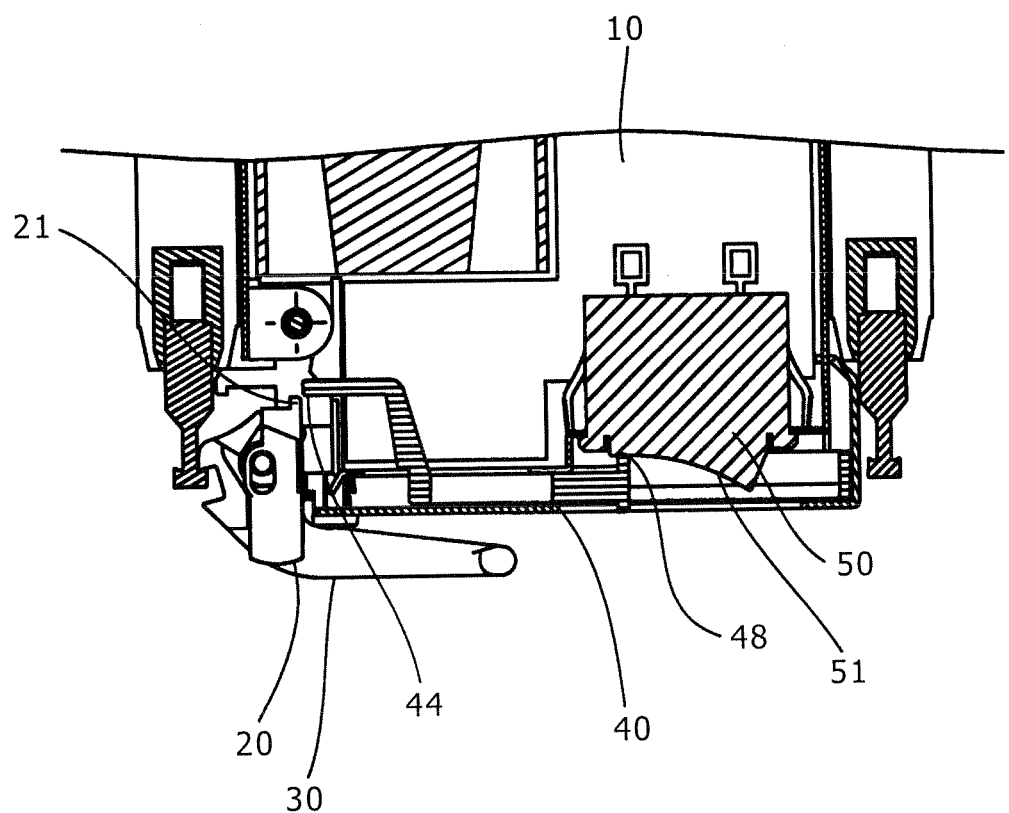

The power-supply unit 10 illustrated in FIG. 12 is in the power-off state and is secured to the electronics housing rack 2.

The switch cover 40 is at the lock-releasing operation permitting position and the lock-releasing restricting portion 44 is retreated from the movable range of the contact portion 21 to permit the depressing operation of the lock-releasing button 20.

The movable operating portion 51 of the power switch 50 is such that the rightward slide travel of the switch cover 40 allows an operation restricting portion 48 to restrict the switching operation of the movable operating portion 51.

The lock-releasing button 20 is in the state where the depressing operation is permitted. However, since the lock-releasing button 20 is biased by the elastic member, it is at the retreated position.

Figure 13:
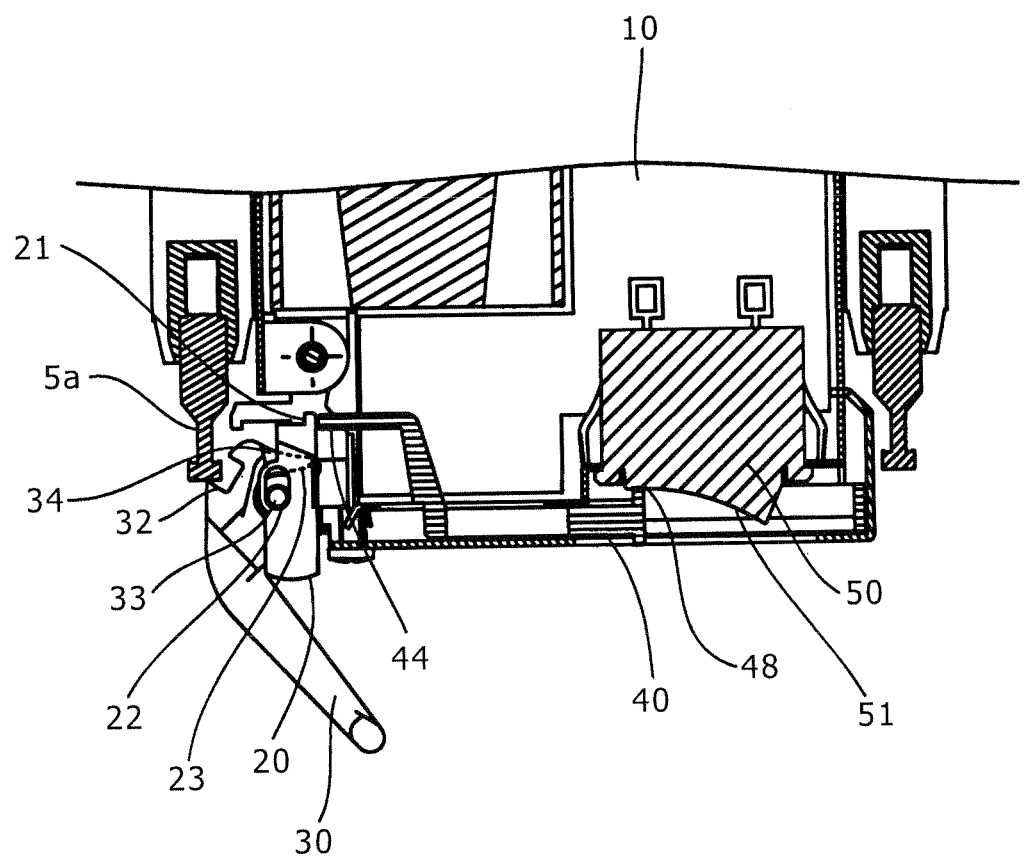

The power-supply unit 10 illustrated in FIG. 13 is released from the securing state secured to the electronics housing rack 2 while being in the power-off state.

The switch cover 40 is at the lock-releasing operation permitting position and the lock-releasing button 20 is operatively depressed. Therefore, it is restricted for the switch cover 40 to slidably travel leftward. Thus, the switch cover 40 maintains the state where the operation restricting portion 48 restricts the switching operation of the movable operating portion 51.

The lock-releasing button 20 is operatively depressed and is at a position where a claw-receiving portion 23 can receive the claw 34. This permits the power-supply attachment/detachment lever 30 to turn clockwise.

The power-supply attachment/detachment lever 30 is turned clockwise to release the engagement between the unit retaining portion 5a and the engaging portion 32. This releases the securing of the power-supply unit 10 to the electrics housing rack 2. Then, the power-supply unit attachment/detachment lever 30 pulls out the power-supply unit 10 from the electronics housing rack 2 with the contact portion between the unit retaining portion 5a and the engaging portion 32 serving as a fulcrum point. The power-supply attachment/detachment lever 30 where the claw 34 is fitted to the claw-receiving portion 23 maintains the lock-releasing button 20 at the power-supply attachment/detachment operation restriction releasing position.

As described above, the power-supply unit 10 maintains the power-off state in the state where the power-supply unit 10 is attachable/detachable to/from the electronics housing rack 2 by turning the power-supply attachment/detachment lever 30. Thus, the inadvertent attachment/detachment operation of the power-supply unit 10 is prevented. The power-supply unit 10 may be to be housed into the electronics housing rack 2 with the power-supply attachment/detachment lever 30 secured (the state illustrated in FIG. 9 or 10). In such a case, the engaging portion 32 interferes with the unit retaining portion 5a. Therefore, if the power-supply unit 10 is to be housed in the electronics housing rack 2, the power-supply attachment/detachment lever 30 has to be in the turned state. In this way, it is guaranteed that the power-supply unit 10 is in the power-off state during the attachment/detachment to/from the electronics housing rack 2. Thus, the inadvertent attachment/detachment operation of the power-supply unit 10 is prevented.

The description has been given of the power-supply unit 10 housed in the electronics housing rack 2 thus far. However, the same attachment/detachment mechanism can be applied also to the electronics unit 3. In this case, the electronics unit 3 may use a predetermined operating switch in place of the power switch. For example, the operating switch may be one switching between ON (second state) and OFF (first state) of the predetermined function possessed by the electronics unit 3. Alternatively, the operating switch may be one selecting a plurality of functions (a first state selecting the first function/a second state selecting the second function) possessed by the electronics unit 3. In this way, the electronics unit 3 can avoid a failure resulting from the inadvertent attachment/detachment operation during the selection (operation) of the specified function.

Figure 14A:
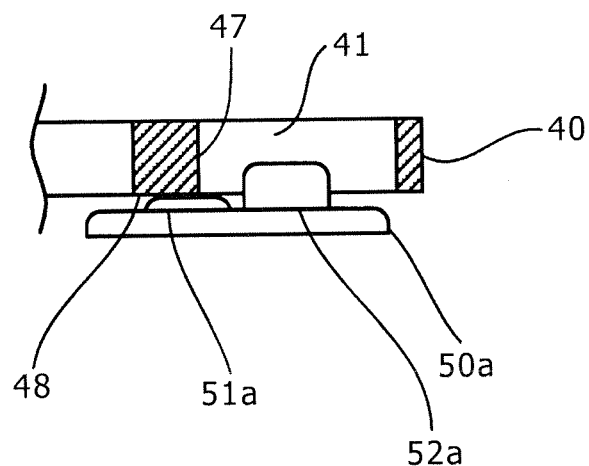
FIGS. 14A and 14B illustrate the relationship between a power switch and a switch cover according to a second embodiment.
Figure 14B:
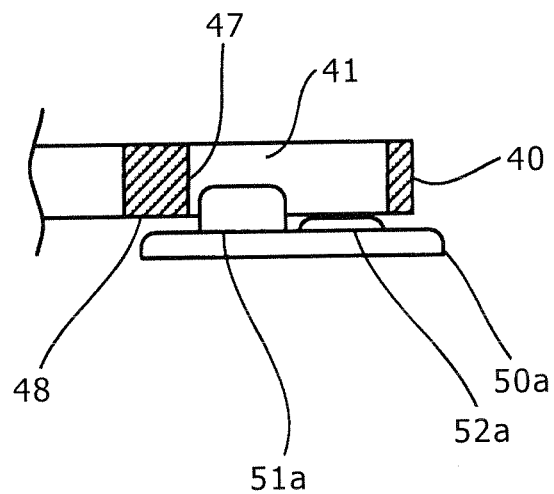

A power switch according to a second embodiment is described with reference to FIGS. 14A and 14B. FIGS. 14A and 14B illustrate the relationship between the power switch according to the second embodiment and a switch cover. The second embodiment is different from the first embodiment in that the power switch 50a is a two-button-type push-button switch.

FIG. 14A illustrates a switch cover 40 lying at a lock-releasing operation permitting position. In this case, the power switch 50a is in a power-off state. The power switch 50a is provided with a movable operating portion 51a and a movable operating portion 52a. The movable operating portion 51a is depressed to provide the power-off state; the movable operating portion 52a is depressed to provide the power-on state. The power switch 50a releases the state where the movable operating portion 52a is released, while being in the power-off state. In addition, the power switch 50a releases the state where the movable operating portion 51a is depressed, while being in the power-on state.

The power switch 50a is such that the protrusion amount of the movable operating portion 52a is greater than that of the movable operating portion 51a in the power-off state. The switch cover 40 in the power-off state is such that a contact portion 47 can slidably travel to the switch-state switching restricting position beyond the movable operating portion 51a. In the power-off state, the operation-restricting portion 48 interferes with the movable range of the movable operating portion 51a to restrict the switching operation of the power switch 50a.

FIG. 14B illustrates the switch cover 40 lying at the lock-releasing operation restricting position. In this case, the power switch 50a is in the power-on state; however, it is in the state where the switching operation is permitted.

The power switch 50a in the power-on state is such that the protrusion amount of the movable operation portion 51a is greater than that of the movable operating portion 52a. The switch cover 40 in the power-on state cannot slidably travel to the switch-state switching restricting position because the contact portion 47 interferes with the movable operating portion 51a.

Figure 15A:
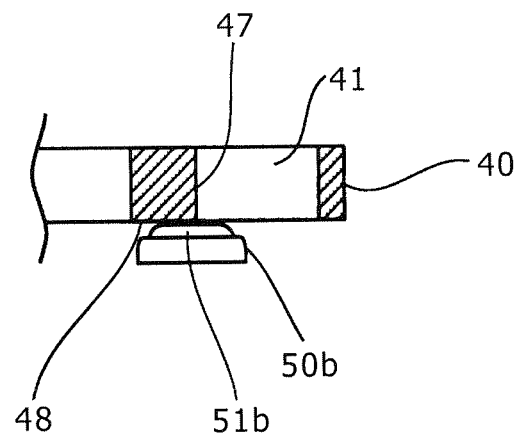
FIGS. 15A and 15B illustrate the relationship between a power switch and a switch cover according to a third embodiment.
Figure 15B:
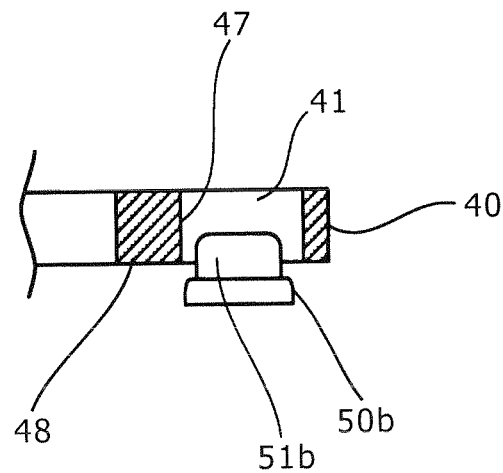

A power switch according to a third embodiment is next described with reference to FIGS. 15A and 15B. FIGS. 15A and 15B illustrate the relationship between the power switch of the third embodiment and a switch cover. The third embodiment is different from the first embodiment in that the power switch 50b is a one-button type push-button switch.

FIG. 15A illustrates the switch cover 40 lying at a lock-releasing operation permitting position. In this case, the power switch 50b is in the power-off state. The power switch 50b is provided with a movable operating portion 51b. The movable operating portion 51 is brought into the depressed state to provide the power-off state. The movable operating portion 51b is brought into the protrusion state to provide the power-on state.

The power switch 50b is such that the protrusion amount of the movable operating portion 51b is greater in the power-on state than in the power-off state. The switch cover 40 in the power-off state is such that the contact portion 47 can slidably travel to the switch-state switching restricting position beyond the contact position with the movable operating portion 51b. In the power-off state, the operation restricting portion 48 interferes with the movable range of the movable operating portion 51b to restrict the switching operation of the power switch 50b.

FIG. 15B illustrates the switch cover 40 lying at the lock-releasing operation restricting position. In this case, the power switch 50b is in the power-on state; however, it is in the state where switching operation is permitted.

The power switch 50b is such that the protrusion amount of the movable operating portion 51b is greater in the power-on state than in the power-off state. The switch cover 40 in the power-on state cannot slidably travel to the switch-state switching restricting position because the contact portion 47 interferes with the movable operating portion 51b.

Incidentally, the embodiments described above can be modified in various ways not departing from the gist of the present invention.

Further, the embodiments described above can be modified or altered in many numbers by those skilled in the art and should not be limited to the specifically described configurations and applications.

The present application contains subject matter related to that disclosed in Japanese Priority Patent Application JP 2010-090071 filed in the Japan Patent Office on Apr. 9, 2010, the entire content of which is hereby incorporated by reference.

What is claimed is:

1. An attachment/detachment mechanism for an electronics unit mounted on a casing in an attachable/detachable manner, comprising:
   a position-keeping type switch configured to switch between first and second states of the electronics unit;
   a lever configured to switch between a securing state where the electronics unit is secured to the casing and an attachable/detachable state where the electronics unit is made attachable/detachable to/from the casing;
   a first restricting member configured to switch between a restricting state where state-switching of the lever is restricted and a permitting state where the state-switching of the lever is permitted; and
   a second restricting member configured to travel between a first position where the state-switching of the first restricting member is restricted and the state-switching of the position-keeping type switch is permitted, and a second position where the state-switching of the first restricting member is permitted and the state-switching of the position-keeping type switch from the first state to the second state is restricted.

2. The attachment/detachment mechanism for the electronics unit according to claim 1, wherein the position-keeping type switch restricts the travel of the second restricting member from the second position to the first position in the second state.

3. The attachment/detachment mechanism for the electronics unit according to claim 2, wherein
   the lever holds the permitting state of the first restricting member in the attachable/detachable state; and
   the first restricting member in the permitting state restricts the travel of the second restricting member from the second position to the first position.

4. The attachment/detachment mechanism for the electronics unit according to claim 3, wherein the securing state restricts the attachment of the electronics unit to the casing.

5. The attachment/detachment mechanism for the electronics unit according to claim 3, wherein the second restricting member slidably travels between the first position and the second position.

6. The attachment/detachment mechanism for the electronics unit according to claim 5, wherein
the electronics unit is provided with a front cover having an operation window used to operate the position-keeping type switch; and
the second restricting member is provided with an operation portion for the slide travel so as to face the operating window.

7. The attachment/detachment mechanism for the electronics unit according to claim 3, wherein
the position-keeping type switch has a switching-operating portion used to operatively switch between the first state and the second state; and
the switching-operating portion retreats from a movable range of the second restricting member in the first state and interferes with the movable range of the second restricting member in the second state.

8. The attachment/detachment mechanism for the electronics unit according to claim 3, wherein
the position-keeping type switch has a switching-operating portion used to operatively switch between the first state and the second state; and
the second restricting member retreats from a movable range of the switching operating portion at the first position and interferes with the movable range of the switching operating portion at the second position.

9. The attachment/detachment mechanism for the electronics unit according to claim 8, wherein the second restricting member shields a portion of the switching-operating portion from an operator site at the second position.

10. The attachment/detachment mechanism for the electronics unit according to claim 3, wherein
the electronics unit is provided with a front cover having a vent hole adapted to ventilate the inside of the electronics unit; and
the lever is provided with a ventilation window at a gripping portion which is located in front of the vent hole at a position where the lever is switched to the securing state.

11. The attachment/detachment mechanism for the electronics unit according to claim 10, wherein the second restricting member is provided with a ventilation window which is located in rear of the vent hole when the second restricting member is at the first position.

12. An electronics unit mounted on a casing in an attachable/detachable manner, comprising;
a position-keeping type switch configured to switch between first and second states of the electronics unit;
a lever configured to switch between a securing state where the electronics unit is secured to the casing and an attachable/detachable state where the electronics unit is made attachable/detachable to/from the casing;
a first restricting member configured to switch between a restricting state where state-switching of the lever is restricted and a permitting state where the state-switching of the lever is permitted; and
a second restricting member configured to travel between a first position where the state-switching of the first restricting member is restricted and the state-switching of the position-keeping type switch is permitted, and a second position where the state switching of the first restricting member is permitted and the state-switching of the position-keeping type switch from the first state to the second state is restricted.

13. A power-supply unit mounted to a casing in an attachable/detachable manner, comprising
a position-keeping type switch configured to switch between first and second states of the power-supply unit;
a lever configured to switch between a securing state where the power-supply unit is secured to the casing and an attachable/detachable state where the power-supply unit is made attachable/detachable to/from the casing;
a first restricting member configured to switch between a restricting state where state-switching of the lever is restricted and a permitting state where the state-switching of the lever is permitted; and
a second restricting member configured to travel between a first position where the state-switching of the first restricting member is restricted and the state-switching of the position-keeping type switch is permitted, and a second position where the state-switching of the first restricting member is permitted and the state-switching of the position-keeping type switch from the first state to second state is restricted.

14. An electronics apparatus in which an electronics unit is mounted to a easing in an attachable/detachable manner, wherein
the casing is provided with a retaining portion retaining the electronics unit, and
the electronics unit includes:
a position-keeping type switch configured to switch between first and second states of the electronics unit;
a lever configured to switch between an engaging state where the electronics unit is engaged with the retaining portion and an attachable/detachable state where the electronics unit is made attachable/detachable to/from the casing;
a first restricting member configured to switch between restricting state where state-switching of the lever is restricted and a permitting state where the state-switching of the lever is permitted; and
a second restricting member configured to travel between a first position where the state-switching of the first restricting member is restricted and the state-switching of the position-keeping type switch is permitted, and a second position where the state-switching of the first restricting member is permitted and the state-switching of the position-keeping type switch from the first state to the second state is restricted.

* * * * *